(12) United States Patent
Sakurai et al.

(10) Patent No.: US 8,508,914 B2
(45) Date of Patent: Aug. 13, 2013

(54) CERAMIC ELECTRONIC COMPONENT AND METHOD OF MANUFACTURING CERAMIC ELECTRONIC COMPONENT

(75) Inventors: Toshio Sakurai, Tokyo (JP); Hisashi Kobuke, Tokyo (JP); Tomohiro Arashi, Tokyo (JP); Takahiro Nakano, Tokyo (JP); Yasuharu Miyauchi, Tokyo (JP)

(73) Assignee: TDK Corporation, Tokyo (JP)

( * ) Notice: Subject to any disclaimer, the term of this patent is extended or adjusted under 35 U.S.C. 154(b) by 137 days.

(21) Appl. No.: 13/025,792

(22) Filed: Feb. 11, 2011

(65) Prior Publication Data
US 2011/0242728 A1 Oct. 6, 2011

(30) Foreign Application Priority Data
Mar. 31, 2010 (JP) ................................. 2010-080387

(51) Int. Cl.
*H01G 4/06* (2006.01)

(52) U.S. Cl.
USPC .................. 361/321.1; 361/306.1; 361/306.3; 361/311; 361/312; 361/321.5

(58) Field of Classification Search
USPC ................ 361/321.1, 306.1, 306.3, 311, 312, 361/321.4, 321.5
See application file for complete search history.

(56) References Cited

U.S. PATENT DOCUMENTS

| | | | | |
|---|---|---|---|---|
| 4,548,910 A | * | 10/1985 | Irisawa | .......................... 501/137 |
| 5,041,342 A | | 8/1991 | Umeda et al. | |
| 5,870,273 A | | 2/1999 | Sogabe et al. | |
| 6,051,516 A | * | 4/2000 | Mizuno et al. | ................. 501/138 |
| 6,458,734 B1 | * | 10/2002 | Sugimoto et al. | ............. 501/139 |
| 6,477,036 B2 | * | 11/2002 | Kitagawa et al. | ............. 361/312 |
| 6,602,616 B2 | | 8/2003 | Sugimoto et al. | |
| 7,333,318 B2 | * | 2/2008 | Hidaka et al. | ............... 361/321.1 |
| 8,076,257 B1 | * | 12/2011 | Wilson | ........................... 501/139 |
| 2009/0004438 A1 | | 1/2009 | Urakawa | |
| 2011/0223431 A1 | | 9/2011 | Sakurai et al. | |

FOREIGN PATENT DOCUMENTS

| | | |
|---|---|---|
| CN | 1360320 A | 7/2002 |
| EP | 2 234 128 A1 | 9/2010 |
| JP | A 61-212101 | 9/1986 |
| JP | A 2-086188 | 3/1990 |
| JP | B2 2739767 | 1/1998 |
| JP | A-10-106880 | 4/1998 |
| JP | A-10-125557 | 5/1998 |
| JP | A-11-243034 | 9/1999 |

(Continued)

OTHER PUBLICATIONS

Translation of Office Action issued in Japanese Application No. 2010-080387 dated Jan. 24, 2012.

(Continued)

*Primary Examiner* — Jayprakash N Gandhi
*Assistant Examiner* — Hung Dang
(74) *Attorney, Agent, or Firm* — Oliff & Berridge, PLC

(57) ABSTRACT

A ceramic electronic component includes a first dielectric layer, a second dielectric layer, and an intermediate layer. The first dielectric layer is a layer containing BaO, $Nd_2O_3$, and $TiO_2$, the second dielectric layer is a layer containing a different material from the material of the first dielectric layer, and the intermediate layer is a layer formed between the first dielectric layer and the second dielectric layer and containing main components that are not contained in the first dielectric layer and the second dielectric layer in common as the main components.

3 Claims, 4 Drawing Sheets

(56) References Cited

FOREIGN PATENT DOCUMENTS

| | | |
|---|---|---|
| JP | A-2000-247735 | 9/2000 |
| JP | A 2001-284807 | 10/2001 |
| JP | A-2003-267778 | 9/2003 |
| JP | A-2010-226038 | 10/2010 |
| JP | A-2011-211158 | 10/2011 |

OTHER PUBLICATIONS

Extended European Search Report issued in European Patent Application No. 11155122.2 dated Jul. 19, 2011.
Sep. 19, 2012 Decision of Patent Grant issued in Japanese Patent Application No. 2010-080387 (with English-language Translation).
May 14, 2013 Notification of First Office Action issued in Chinese Application No. 201110084040.5.

* cited by examiner

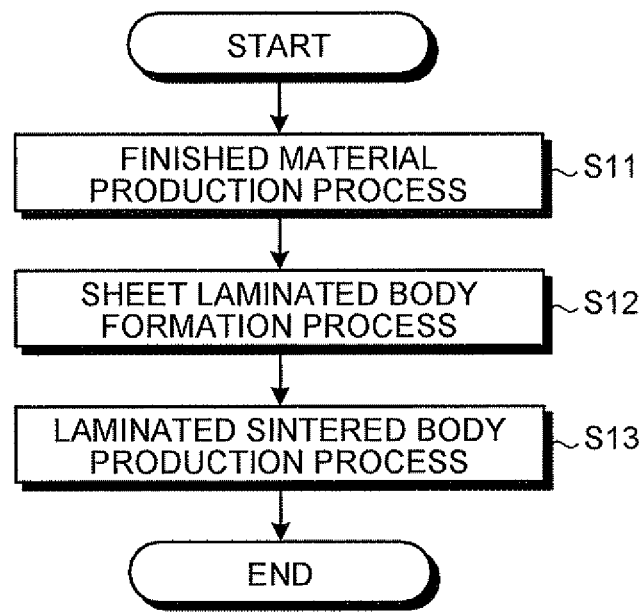
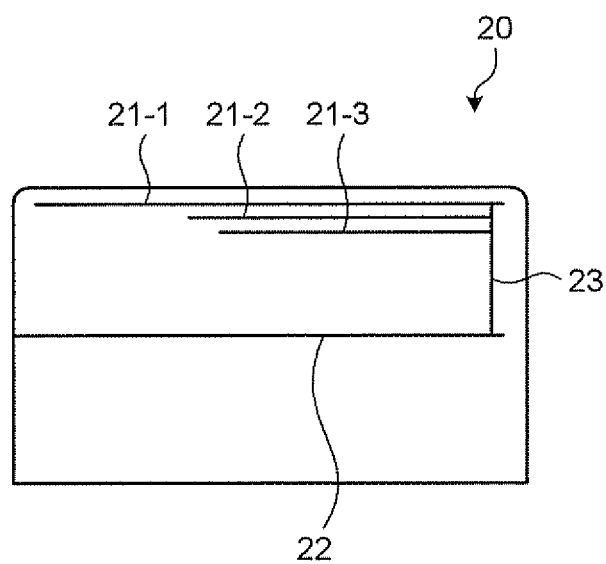

CERAMIC ELECTRONIC COMPONENT AND METHOD OF MANUFACTURING CERAMIC ELECTRONIC COMPONENT

CROSS-REFERENCE TO RELATED APPLICATIONS

This application is based upon and claims the benefit of priority from Japanese Patent Application No. 2010-080387, filed Mar. 31, 2010, the entire contents of which are incorporated herein by reference.

BACKGROUND OF THE INVENTION

1. Field of the Invention

The present invention relates to a ceramic electronic component and a method of manufacturing a ceramic electronic component.

2. Description of the Related Art

In recent years, with developments in miniaturization and higher performance of products in fields such as mobile communication devices including mobile phones, AV devices, and computer devices, miniaturization and higher performance of various electronic components used in these devices are also demanded. To address miniaturization and higher performance of such various electronic components, surface mount devices (SMDs) having a conductor (hereinafter, referred to as an "internal conductor") such as an electrode and wire in the substrate are now mainstream as electronic devices.

An SMD has a printed board on which each component such as an IC chip and other chip components is mounted. As an electronic device mounted on the SMD, a laminated ceramic electronic component obtained by simultaneously calcining a plurality of kinds of ceramic compositions having different material characteristics is used. The laminated ceramic electronic component includes, for example, an LC filter made up of a combination of magnetic material and dielectric material and a circuit substrate (element) containing a capacitor made up of a combination of high dielectric constant material and low dielectric constant material.

With an LC filter, a combination of an inductor portion made of a ceramic material having a low dielectric constant and a high Q factor in order to provide a high self-resonant frequency and a capacitor portion made of a material having excellent temperature characteristics and a high dielectric constant results in an LC element having a high Q factor and excellent temperature characteristics. With a capacitor contained in the circuit substrate, a combination of a high dielectric constant material and a low dielectric constant material results in a reduced distributed capacitance compared with a capacitor made of only a high dielectric constant material and an increased capacity compared with a capacitor made of only a low dielectric constant material.

A known laminated ceramic electronic component is provided as, for example, a circuit substrate created by simultaneously calcining and integrating an insulating layer having a high relative dielectric constant in a microwave band and also a high Q factor and an insulating layer having a low relative dielectric constant (see Japanese Laid-open Patent Publication No. 2001-284807, for example). Another known laminated ceramic electronic component is provided as a dielectric resonator created by arranging and integrally calcining layer materials with different dielectric constants (see Japanese Laid-open Patent Publication No. 61-212101 and Japanese Laid-open Patent Publication No. 02-086188, for example). A still another known laminated ceramic electronic component is provided as a green sheet laminated body in which a glass ceramic layer of third glass ceramic whose composition ratio is intermediate between those of a first green sheet and a second green sheet is placed therebetween and the first green sheet, the second green sheet, and the third green sheet have the same components (see Japanese Patent No. 2739767, for example).

However, in an electronic device formed by simultaneously calcining different materials to laminate a plurality of dielectric layers, there is a problem that adhesion between dielectric layers may be insufficient, thereby making dielectric layers more likely to peel. Thus, in an electronic device including a ceramic electronic component created by laminating a plurality of dielectric layers, development of ceramic electronic components that are not subject to limitations of materials of dielectric layers to be combined is desired.

SUMMARY OF THE INVENTION

A ceramic electronic component according to an aspect of the present invention includes a first dielectric layer containing $BaO$, $Nd_2O_3$, and $TiO_2$; a second dielectric layer containing a material different from the first dielectric layer; and an intermediate layer provided between the first dielectric layer and the second dielectric layer and containing a main component that is not contained in the first dielectric layer and the second dielectric layer in common.

A method of manufacturing a ceramic electronic component according to another aspect of the present invention includes mixing a first base material containing Ba, Nd, and Ti and a first additive containing at least ZnO to prepare a first mixture; calcining the first mixture in oxygen atmosphere at a temperature of 800° C. or more and 950° C. or less to produce a first finished material; mixing a second base material containing a material different from the first base material and a second additive containing at least ZnO to prepare a second mixture; calcining the second mixture in oxygen atmosphere at a temperature of 800° C. or more and 950° C. or less to produce a second finished material; calcining an intermediate material containing a material that are not contained in the first base material and the second base material in common in oxygen atmosphere at a temperature of 800° C. or more and 950° C. or less to produce a third finished material; stacking a first sheet body, a third sheet body, and a second sheet body in this order to form a sheet laminated body so that the third sheet body is laminated between the first sheet body and the second sheet body, the first sheet body being obtained by forming a first slurry containing the first finished material in a sheet shape, the second sheet body being obtained by forming a second slurry containing the second finished material in a sheet shape, the third sheet body being obtained by forming a third slurry containing the intermediate material in a sheet shape; and calcining the sheet laminated body to produce a laminated sintered body.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 2 is a flow chart showing a method of manufacturing ceramic electronic components according to the exemplary embodiment of the present invention;

FIG. 3 is a conceptual diagram schematically showing an embodiment when the ceramic electronic component in the present embodiment is used as an LC filter;

DETAILED DESCRIPTION OF THE PREFERRED EMBODIMENTS

The present invention will be described in detail below with reference to drawings. However, the present invention is not limited by the following mode (hereinafter, referred to as an embodiment) to carry out the present invention. Elements in the following embodiment include those elements easily conceived by a person skilled in the art and substantially identical elements, so-called equivalents. Further, elements disclosed by the following embodiment can be combined when appropriate.

Embodiment

Figure 1:
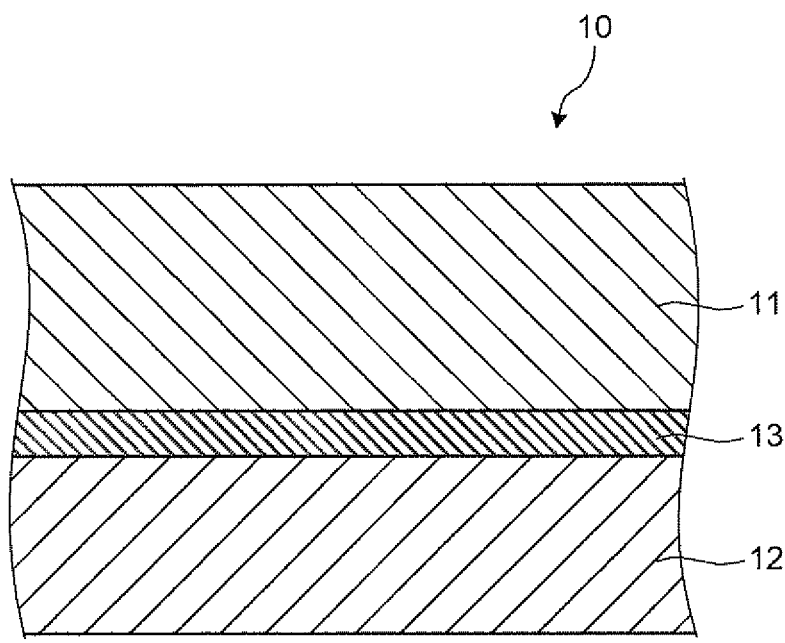
FIG. 1 is a simplified sectional view showing the configuration of a ceramic electronic component according to an exemplary embodiment of the present invention.

An embodiment of a ceramic electronic component of the present invention will be described below with reference to drawings. FIG. 1 is a simplified sectional view showing the configuration of a ceramic electronic component according to an embodiment of the present invention. As shown in FIG. 1, a ceramic electronic component 10 in the present embodiment includes a first dielectric layer 11, a second dielectric layer 12, and an intermediate layer 13. The first dielectric layer 11 is a layer containing BaO, $Nd_2O_3$, and $TiO_2$, the second dielectric layer 12 is a layer containing materials that are different from those of the first dielectric layer 11, and the intermediate layer 13 is a layer formed between the first dielectric layer 11 and the second dielectric layer 12 and contains a main component that is not commonly contained in the first dielectric layer 11 and the second dielectric layer 12.

First Dielectric Layer

The first dielectric layer 11 is configured by a layer whose main component contains BaO, $Nd_2O_3$, and $TiO_2$.

Main Component

The main component of the first dielectric layer 11 contains at least BaO, $Nd_2O_3$, and $TiO_2$. The main component is, for example, BaO—$Nd_2O_3$—$TiO_2$ based or $Bi_2O_3$—BaO—$Nd_2O_3$—$TiO_2$ based dielectric ceramic. Contents of BaO, $Nd_2O_3$, and $TiO_2$ are not specifically limited and may be adjusted when necessary.

For a BaO—$Nd_2O_3$—$TiO_2$ based compound, a compound represented by a composition formula in the following formula (1) and satisfying relations represented by the following relation (2) to relation (5) is preferable, where x, y, and z in the following formula (1) and relations (2) to (5) are in mole percent.

$$xBaO \cdot yNd_2O_3 \cdot zTiO_2 \quad (1)$$

$$6.0 \leq x \leq 23.0 \quad (2)$$

$$13.0 \leq y \leq 30.0 \quad (3)$$

$$64.0 \leq z \leq 68.0 \quad (4)$$

$$x+y+z=100 \quad (5)$$

When an alternating current is applied to an ideal dielectric ceramic, the current and the voltage normally has a phase difference of 90 degrees. However, if the frequency of the AC current increases to reach a high frequency, the electric polarization of the dielectric ceramic or the orientation of polar molecules cannot follow changes in electric field of the high frequency or the electric flux density has a delay in phase (phase difference) with respect to the electric field due to conduction of electron or ion so that the actual current and voltage have a phase difference other than 90 degrees. A phenomenon in which a portion of energy of the high frequency is converted into heat and dissipated due to such a phase difference is called an inductive dielectric loss. The magnitude of the dielectric loss is represented by the Q·f factor. The Q·f factor increases with a decreasing dielectric loss and decreases with an increasing dielectric loss.

The Q·f factor which represents the magnitude of the dielectric loss is a product of the phase difference between the actual current and voltage, a Q factor: an inverse of the tangent tan δ of a loss angle δ, which is a difference from 90 degrees of the ideal current and voltage (Q=1/tan δ), and a resonance frequency f.

Sub-Component

The first dielectric layer 11 may further contain a sub-component thereof. The sub-component contained in the first dielectric layer 11 includes zinc oxide (ZnO), boron oxide ($B_2O_3$), and copper oxide (CuO), but is not limited to these.

With each of the above sub-components being contained in the first dielectric layer 11, the sintering temperature of the first dielectric layer 11 can be lowered. A conductive material composed of an Ag based metal or the like is used as an internal conductor of the ceramic electronic component 10. By lowering the sintering temperature of the first dielectric layer 11 to below the melting point of the conductive material by including each sub-component in the first dielectric layer 11, the first dielectric layer 11 can be calcined at a lower temperature.

Though the content of the sub-component is not specifically limited, it is preferable that the quantity of the sum of all sub-components with respect to the sum of all main components be 0.3% or more and 12.0% or less by mass.

If zinc oxide is contained as a sub-component, the content of zinc oxide is, as the mass ratio of ZnO when the mass of zinc oxide is converted as ZnO, preferably 0.1% or more and 7.0% or less by mass with respect to the main component of 100% by mass, and particularly preferably 1.5% or more and 7.0% or less by mass.

If boron oxide is contained as a sub-component, the content of boron oxide is, as the mass ratio of $B_2O_3$ when the mass of boron oxide is converted as $B_2O_3$, preferably 0.1% or more and 3.0% or less by mass with respect to the main component of 100% by mass, and particularly preferably 1.0% or more and 2.5% or less by mass.

If copper oxide is contained as a sub-component, the content of copper oxide is, as the mass ratio of CuO when the mass of copper oxide is converted as CuO, preferably 0.1% or more and 2.0% or less by mass with respect to the main component of 100% by mass, and particularly preferably 0.7% or more and 1.3% or less by mass.

Second Dielectric Layer

The second dielectric layer 12 is a dielectric layer containing a material that is different from that of the first dielectric layer 11. Like the first dielectric layer 11, the second dielectric layer 12 includes the main component and sub-component, but may be constituted exclusively of the main component. In the present embodiment, the second dielectric layer 12 includes the main component and sub-component. A dielectric layer containing a material that is different from that of the first dielectric layer 11 may be provided if components of the second dielectric layer 12 are not completely identical to those of the first dielectric layer 11. For example, a portion of components of the first dielectric layer 11 may be contained in the second dielectric layer 12.

Main Component

The main component of the second dielectric layer 12 only needs to be a different material from that of the first dielectric layer 11 and the type thereof is not specifically limited. A publicly known material may be used as the main component of the second dielectric layer 12. The main component contained in the second dielectric layer 12 includes, for example, forsterite ($2MgO \cdot SiO_2$), enstatite ($MgO \cdot SiO_2$), and diopside ($CaO \cdot MgO \cdot 2SiO_2$). Among these components, a dielectric layer having forsterite as the main component is preferable in view of a low relative dielectric constant ∈r and a large Q·f factor.

Sub-Component

The same sub-component as that contained in the first dielectric layer 11 is used as a sub-component contained in the second dielectric layer 12. If the main component contained in the second dielectric layer 12 is only forsterite, the content of the sub-component increases when only forsterite is sintered at a low temperature. Thus, the content of the sub-component contained in the second dielectric layer 12 is, as the quantity of the sum of all sub-components with respect to the sum of all main components, preferably 16.1% or more and 48.0% or less by mass.

If zinc oxide is contained as a sub-component, the content of zinc oxide is, as the mass ratio of ZnO when the mass of zinc oxide is converted as ZnO, preferably 9.0% or more and 18.0% or less by mass with respect to the main component of 100% by mass, and particularly preferably 10.0% or more and 16.0% or less by mass.

If boron oxide is contained as a sub-component, the content of boron oxide is, as the mass ratio of $B_2O_3$ when the mass of boron oxide is converted as $B_2O_3$, preferably 4.0% or more and 10.0% or less by mass with respect to the main component of 100% by mass, and particularly preferably 4.0% or more and 10.0% or less by mass.

If copper oxide is contained as a sub-component, the content of copper oxide is, as the mass ratio of CuO when the mass of copper oxide is converted as CuO, preferably 1.0% or more and 8.0% or less by mass with respect to the main component of 100% by mass, and particularly preferably 2.0% or more and 6.0% or less by mass.

If calcium oxide, which is an alkali-earth metal oxide, is contained as a sub-component, the content of calcium oxide is, as the mass ratio of $CaCO_3$ when the mass of calcium oxide is converted as $CaCO_3$, preferably 0.1% or more and 6.0% or less by mass with respect to the main component of 100% by mass, and particularly preferably 0.1% or more and 4.0% or less by mass.

If glass is contained as a sub-component, the content of glass is preferably 2.0% or more and 6.0% or less by mass with respect to the main component of 100% by mass, and particularly preferably 4.0% or more and 6.0% or less by mass.

The sub-component is not limited to the above-mentioned zinc oxide, boron oxide, copper oxide, alkali-earth metal oxide, and glass and may contain at least one of $Bi_2O_3$, CoO, MnO, and the like.

Intermediate Layer

The intermediate layer 13 is formed between the first dielectric layer 11 and the second dielectric layer 12 and contains the main component that is not contained commonly in both the first dielectric layer 11 and the second dielectric layer 12. With the presence of the intermediate layer 13 between the first dielectric layer 11 and the second dielectric layer 12, generation of pores and an occurrence of shift between a dielectric layer and the intermediate layer can be suppressed in a boundary between the first dielectric layer 11 or the second dielectric layer 12 and the intermediate layer 13 and thus, the first dielectric layer 11 and the second dielectric layer 12 can be laminated while possessing strong adhesive strength via the intermediate layer 13. Therefore, with the formation of the intermediate layer 13 between the first dielectric layer 11 and the second dielectric layer 12, peeling of the laminated first dielectric layer 11 and second dielectric layer 12 can be suppressed.

The intermediate layer 13 has a main component among main components contained in the first dielectric layer 11 that is not contained in the second dielectric layer 12 as a common component and a main component among main components contained in the second dielectric layer 12 that is not contained in the first dielectric layer 11 as a common component. Thus, the component contained in the intermediate layer 13 and common to one of main components of the first dielectric layer 11 suppresses generation of pores and an occurrence of shift between the first dielectric layer 11 and the intermediate layer 13 in a boundary with the first dielectric layer 11, improving reactivity with the first dielectric layer 11. Also, the component contained in the intermediate layer 13 and common to one of main components of the second dielectric layer 12 suppresses generation of pores and an occurrence of shift between the second dielectric layer 12 and the intermediate layer 13 in a boundary with the second dielectric layer 12, improving reactivity with the second dielectric layer 12.

When the first dielectric layer 11 and the second dielectric layer 12 are laminated and simultaneously calcined, if components forming the first dielectric layer 11 and those forming the second dielectric layer 12 are different materials, contraction behavior due to heat is considered to be different. Thus, materials containing the same components as components forming the first dielectric layer 11 and those forming the second dielectric layer 12 are used as components forming the first dielectric layer 11 and those forming the second dielectric layer 12 and tend to be limited. Moreover, if the material forming the first dielectric layer 11 and that forming the second dielectric layer 12 are directly in contact with each other, it becomes necessary to consider reactivity such as generation of pores in a boundary of materials forming each dielectric layer and an occurrence of shift between dielectric layers. In the present embodiment, thanks to the presence of a material forming the intermediate layer 13 between the material forming the first dielectric layer 11 and that forming the second dielectric layer 12, generation of pores and an occurrence of shift between the first dielectric layer 11 or the second dielectric layer 12 and the intermediate layer 13 can be suppressed regardless of whether or not components forming the first dielectric layer 11 and those forming the second dielectric layer 12 are the same so that the first dielectric layer 11 and the second dielectric layer 12 can simultaneously be calcined.

Thus, with the presence of the intermediate layer 13 between the first dielectric layer 11 and the second dielectric layer 12, generation of pores and an occurrence of shift between dielectric layers and the intermediate layer can be suppressed in a boundary between the first dielectric layer 11 or the second dielectric layer 12 and the intermediate layer 13 and therefore, the first dielectric layer 11 and the second dielectric layer 12 can be laminated while possessing strong adhesive strength via the intermediate layer 13 and peeling of dielectric layers in which a plurality of dielectric layers are laminated can be suppressed The intermediate layer 13 may contain a component that is not contained in the second dielectric layer 12 and is contained only in the first dielectric layer 11 more in a boundary between the intermediate layer 13 and the first dielectric layer 11 than in a boundary between the intermediate layer 13 and the second dielectric layer 12. Moreover, the intermediate layer 13 may contain a component that is not contained in the first dielectric layer 11 and is contained only in the second dielectric layer 12 more in a boundary between the intermediate layer 13 and the second dielectric layer 12 than in a boundary between the intermediate layer 13 and the first dielectric layer 11. With the component contained only in the first dielectric layer 11 more in the boundary between the intermediate layer 13 and the first dielectric layer 11 than in the boundary between the intermediate layer 13 and the second dielectric layer 12, the intermediate layer 13 can suppress generation of pores in the boundary with the first dielectric layer 11 and an occurrence of shift between the first dielectric layer 11 and the intermediate layer 13 so as to improve reactivity. Moreover, with the component contained only in the second dielectric layer 12 more in the boundary between the intermediate layer 13 and the second dielectric layer 12 than in the boundary between the intermediate layer 13 and the first dielectric layer 11, the intermediate layer 13 can suppress generation of pores in the boundary with the second dielectric layer 12 and an occurrence of shift between the second dielectric layer 12 and the intermediate layer 13 so as to improve reactivity.

Thus, even if the first dielectric layer 11 and the second dielectric layer 12 contain different materials, by providing a material forming the intermediate layer 13 between the material forming the first dielectric layer 11 and that forming the second dielectric layer 12, the first dielectric layer 11 and the second dielectric layer 12 can simultaneously be calcined and adhesive strength between the intermediate layer 13 and the first dielectric layer 11 or the second dielectric layer 12 can be improved.

If the first dielectric layer 11 and the second dielectric layer 12 contain the same component, the intermediate layer 13 contains a component forming the first dielectric layer 11 or the second dielectric layer 12 more in a boundary with the dielectric layer in which the ratio of components contained in one of the first dielectric layer 11 and the second dielectric layer 12 is higher. This is because, among components forming a dielectric layer, a component whose ratio is higher tends to increase the amount thereof that diffuses into a material forming the intermediate layer.

The intermediate layer 13 may contain a component contained in one of the first dielectric layer 11 or the second dielectric layer 12 in such a way that the ratio thereof decreases from the side of the dielectric layer in which the ratio of the component contained in one of the first dielectric layer 11 or the second dielectric layer 12 is higher toward the side of the dielectric layer in which the ratio thereof is lower. Inside the intermediate layer 13, a component contained in the intermediate layer 13 and the first dielectric layer 11 in common diffuses more to the side of the first dielectric layer 11 and the amount of diffusion thereof decreases toward the second dielectric layer 12. A component contained in the intermediate layer 13 and the second dielectric layer 12 in common diffuses more to the side of the second dielectric layer 12 and the amount of diffusion thereof decreases toward the first dielectric layer 11. By diffusing a component contained in one of the first dielectric layer 11 or the second dielectric layer 12 in common to the side of the dielectric layer, the intermediate layer 13 is considered to suppress generation of pores in the boundary between the first dielectric layer 11 or the second dielectric layer 12 and the intermediate layer 13 a shift between the first dielectric layer 11 or the second dielectric layer 12 and the intermediate layer 13, contributing to improvement of adhesive strength of the intermediate layer 13 to the first dielectric layer 11 and the second dielectric layer 12. Thus, the first dielectric layer 11 and the second dielectric layer 12 can be laminated with stability while possessing strong adhesive strength via the intermediate layer 13.

The intermediate layer 13 is preferably a layer containing at least BaO, $Nd_2O_3$, $TiO_2$, MgO, $SiO_2$, SrO, and CaO. The intermediate layer 13 may contain ZnO, $Bi_2O_3$, CoO, $MnO_2$, $Ag_2O$, and CuO.

The intermediate layer 13 may contain $Nd_2O_3$ and $TiO_2$ more in the boundary between the intermediate layer 13 and the first dielectric layer 11 than in the boundary between the intermediate layer 13 and the second dielectric layer 12 so that $Nd_2O_3$ and $TiO_2$ are contained increasingly less from the first dielectric layer 11 toward the second dielectric layer 12 and may contain MgO, $SiO_2$, SrO, and CaO more in the boundary between the intermediate layer 13 and the second dielectric layer 12 than in the boundary between the intermediate layer 13 and the first dielectric layer 11 so that MgO, $SiO_2$, SrO, and CaO are contained increasingly less from the second dielectric layer 12 toward the first dielectric layer 11.

BaO is present in a first base material forming the first dielectric layer 11 and a second base material forming the second dielectric layer 12 in common, but the ratio of concentration of the first base material forming the first dielectric layer 11 is made higher than that of the second base material forming the second dielectric layer 12. Thus, as BaO diffuses from the first base material forming the first dielectric layer 11 into the second base material forming the second dielectric layer 12, the balance of bivalent ions contained in the first base material forming the first dielectric layer 11 changes. In this case, diffusion of MgO, SrO, and CaO from the second base material forming the second dielectric layer 12 is considered to make adjustments to maintain the balance of components contained in the intermediate layer 13. BaO, $Nd_2O_3$, and $TiO_2$ are considered to form a stable compound mainly based on a tungsten-bronze based crystal structure. Thus, as BaO diffuses from the first dielectric layer 11 into the second dielectric layer 12, $Nd_2O_3$ and $TiO_2$ are considered to move following BaO. Further, $SiO_2$ has the property of forming a stable compound with MgO and thus, $SiO_2$ is also considered to diffuse with the diffusion of MgO. Thus, as BaO diffuses, diffusion of components forming the intermediate layer 13 occurs. $Nd_2O_3$ and $TiO_2$ diffuse mostly to the boundary between the intermediate layer 13 and the first dielectric layer 11 with a decreasing ratio thereof toward the second dielectric layer 12. Accordingly, generation of pores in the boundary between the first dielectric layer 11 and the intermediate layer 13 and an occurrence of shift between the first dielectric layer 11 and the intermediate layer 13 can be suppressed, thereby improving adhesive strength. MgO, $SiO_2$, SrO, and CaO diffuse mostly to the boundary between the intermediate layer 13 and the second dielectric layer 12 with a decreasing ratio thereof toward the first dielectric layer 11. Accordingly, generation of pores in the boundary between the second dielectric layer 12 and the intermediate layer 13 and an occurrence of shift between the second dielectric layer 12 and the intermediate layer 13 can be suppressed, thereby improving adhesive strength.

If $Nd_2O_3$ and $TiO_2$ are contained in the first dielectric layer 11 and are not contained in the second dielectric layer 12, generation of pores in the boundary between the first dielectric layer 11 and the intermediate layer 13 and an occurrence of shift between the first dielectric layer 11 and the intermediate layer 13 are suppressed and adhesive strength is improved by including $Nd_2O_3$ and $TiO_2$ in a decreasing ratio thereof from the first dielectric layer 11 toward the second dielectric layer 12. If MgO, $SiO_2$, SrO, and CaO are contained in the second dielectric layer 12 and are not contained in the first dielectric layer 11, generation of pores in the boundary between the second dielectric layer 12 and the intermediate layer 13 and an occurrence of shift between the second dielectric layer 12 and the intermediate layer 13 are suppressed and adhesive strength is improved by including MgO, $SiO_2$, SrO, and CaO in a decreasing ratio thereof from the second dielectric layer 12 toward the first dielectric layer 11.

Thus, even if the first dielectric layer 11 and the second dielectric layer 12 are layers formed of different materials and the first dielectric layer 11 and the second dielectric layer 12 are formed by lamination, with the presence of the intermediate layer 13 between the first dielectric layer 11 and the second dielectric layer 12, the first dielectric layer 11 and the second dielectric layer 12 can be laminated with stability while possessing strong adhesive strength via the intermediate layer 13. Therefore, with the formation of the intermediate layer 13 between the first dielectric layer 11 and the second dielectric layer 12, peeling of the laminated first dielectric layer 11 and second dielectric layer 12 can be suppressed.

In the present embodiment, ZnO may be contained in both the first dielectric layer 11 and the second dielectric layer 12. If a layer containing ZnO and $TiO_2$ is soaked in an etchant, the layer has the effect of inhibiting infiltration of the etchant into the layer containing ZnO and $TiO_2$. If ZnO is contained in both the first dielectric layer 11 and the second dielectric layer 12 when $TiO_2$ is contained in the first dielectric layer 11 and the second dielectric layer 12, the amount of compounds generated by a reaction of ZnO and $TiO_2$ is considered to increase in the intermediate layer 13 between the first dielectric layer 11 and the second dielectric layer 12. Accordingly, infiltration of the etchant into the intermediate layer 13 can more reliably be prevented. Also, a $ZnTiO_3$ based crystal phase formed by a reaction of ZnO and $TiO_2$ is considered to contribute to adhesive strength between the first dielectric layer 11 and the intermediate layer 13 and adhesive strength between the second dielectric layer 12 and the intermediate layer 13. Thus, by including ZnO in both the first dielectric layer 11 and the second dielectric layer 12, peeling of the laminated first dielectric layer 11 and second dielectric layer 12 can more reliably be suppressed.

The form of Ba contained in the intermediate layer 13 is not specifically limited and includes such as an element or an oxide. In terms of conductivity and life when used in a ceramic electronic component, it is desirable that the form of Ba contained in the intermediate layer 13 be BaO.

The form of Nd contained in the intermediate layer 13 is not specifically limited and includes such as an element or an oxide. In terms of conductivity and life when used in a ceramic electronic component, it is desirable that the form of Nd contained in the intermediate layer 13 be $Nd_2O_3$.

The form of Ti contained in the intermediate layer 13 is not specifically limited and includes such as an element, a titanium oxide, or a titanium compound. The titanium compound includes such as a titanium chloride. In terms of conductivity and life when used in a ceramic electronic component, it is desirable that the form of Ti contained in the intermediate layer 13 be $TiO_2$.

The form of Mg contained in the intermediate layer 13 is not specifically limited and includes such as an element, a magnesium oxide, or a compound. The compound includes such as a magnesium sulfate or a magnesium chloride. In terms of conductivity and life when used in a ceramic electronic component, it is desirable that the form of Mg contained in the intermediate layer 13 be MgO.

The form of Si contained in the intermediate layer 13 is not specifically limited and includes such as an element or an oxide. In terms of conductivity and life when used in a ceramic electronic component, it is desirable that the form of Si contained in the intermediate layer 13 be $SiO_2$.

The form of Sr contained in the intermediate layer 13 is not specifically limited and includes such as an element or an oxide. In terms of conductivity and life when used in a ceramic electronic component, it is desirable that the form of Sr contained in the intermediate layer 13 be SrO.

The form of Zn contained in the intermediate layer 13 is not specifically limited and includes such as an element, an oxide, or a zinc compound. The zinc compound includes such as a zinc sulfate or a zinc chloride. In terms of conductivity and life when used in a ceramic electronic component, it is desirable that the form of Zn contained in the intermediate layer 13 be ZnO.

The form of Bi contained in the intermediate layer 13 is not specifically limited and includes such as an element or an oxide. In terms of conductivity and life when used in a ceramic electronic component, it is desirable that the form of Bi contained in the intermediate layer 13 be $Bi_2O_3$.

The form of Co contained in the intermediate layer 13 is not specifically limited and includes such as an element or an oxide. In terms of conductivity and life when used in a ceramic electronic component, it is desirable that the form of Co contained in the intermediate layer 13 be CoO.

The form of Mn contained in the intermediate layer 13 is not specifically limited and includes such as an element or an oxide. In terms of conductivity and life when used in a ceramic electronic component, it is desirable that the form of Mn contained in the intermediate layer 13 be $MnO_2$.

The form of Ca contained in the intermediate layer 13 is not specifically limited and includes such as an element or an oxide. In terms of conductivity and life when used in a ceramic electronic component, it is desirable that the form of Ca contained in the intermediate layer 13 be CaO.

The form of Ag contained in the intermediate layer 13 is not specifically limited and includes such as an element or an oxide. In terms of conductivity and life when used in a ceramic electronic component, it is desirable that the form of Ag contained in the intermediate layer 13 be $Ag_2O$.

The form of Cu contained in the intermediate layer 13 is not specifically limited and includes such as an element, a copper oxide, or a copper compound. The copper compound includes such as a copper sulfate or a copper chloride. In terms of conductivity and life when used in a ceramic electronic component, it is desirable that the form of Cu contained in the intermediate layer 13 be CuO.

In the present embodiment, the compounding ratio of the above components is not specifically limited and may be adjusted when necessary.

In addition to the above components, the intermediate layer 13 may contain $Fe_2O_3$ and NiO as components contained in the intermediate layer 13.

The thickness of the intermediate layer 13 can be set to a suitable thickness when necessary based on quality of materials of the first dielectric layer 11 and the second dielectric layer 12 or the like and is not specifically limited. In terms of laminating the first dielectric layer 11 and the second dielectric layer 12 with stability while maintaining dielectric characteristics near the boundary between the intermediate layer 13 and the first dielectric layer 11 or the second dielectric layer 12, the thickness of the intermediate layer 13 is preferably 1 µm or more and 20 µm or less. If the thickness of the intermediate layer 13 falls below 1 µm, dielectric characteristics near the boundary with the first dielectric layer 11 and the second dielectric layer 12 cannot be maintained. If the thickness of the intermediate layer 13 exceeds 20 µm, the first dielectric layer 11 and the second dielectric layer 12 cannot be laminated with stability. Moreover, if the intermediate layer is made too thick, there is the possibility of danger that the size in the thickness direction of a product may be out of spec and thus, the thickness of the intermediate layer 13 is preferably 20 µm or less.

In the present embodiment, a boundary surface between the intermediate layer 13 and the first dielectric layer 11 or the second dielectric layer 12 can be determined from, for example, the ratio of quantities of material components contained near the boundary surface between the intermediate layer 13 and the first dielectric layer 11 or the second dielectric layer 12 or a contrast observed during composition (COMPO) image observation using a scanning electron microscope (SEM).

Formation Method of the Intermediate Layer

A method of simultaneously calcining the first dielectric layer 11 and the second dielectric layer 12 to form the intermediate layer 13 is known as a formation method of the intermediate layer 13. The first dielectric layer 11 is constituted of the first base material to configure the first dielectric layer 11 and a first additive, the second dielectric layer 12 is constituted of the second base material to configure the second dielectric layer 12 and a second additive, and an intermediate material containing materials that are not contained in the first base material and the second base material in common is constituted. These first base material, first additive, second base material, second additive, and intermediate material are simultaneously calcined to form the first dielectric layer 11, the second dielectric layer 12, and the intermediate layer 13 and also the first dielectric layer 11, the second dielectric layer 12, and the intermediate layer 13 can be integrated.

The method of forming the intermediate layer 13 is not specifically limited to this and after the first base material to configure the first dielectric layer 11, the first additive, and the intermediate material being stacked and calcined, the second base material to configure the second dielectric layer 12 and the second additive may be stacked on the formed intermediate layer 13 and calcined. Or, after the second dielectric layer 12 and the intermediate material being stacked and calcined, the first base material and the first additive may be stacked on the formed intermediate layer 13 and calcined.

When the first base material and the first additive are calcined to produce calcination powders, the calcining temperature is preferably 800° C. or more and 950° C. or less, more preferably 800° C. or more and 900° C. or less, and most preferably 830° C. or more and 870° C. or less. The calcining time is not specifically limited, but is preferably two hours or more and five hours or less.

When the second base material and the second additive are calcined to produce calcination powders, like the above case, the calcining temperature is preferably 800° C. or more and 950° C. or less, more preferably 800° C. or more and 900° C. or less, and most preferably 830° C. or more and 870° C. or less. The calcining time is not specifically limited, but is preferably two hours or more and five hours or less.

When the intermediate material is calcined to produce calcination powders, like the above cases, the calcining temperature is preferably 800° C. or more and 950° C. or less, more preferably 800° C. or more and 900° C. or less, and most preferably 830° C. or more and 870° C. or less. The calcining time is not specifically limited, but is preferably two hours or more and five hours or less.

After the first base material and the first additive being calcined, a pulverization process is undergone for pulverization to a desired grain size to obtain a first finished material. After the second base material and the second additive being calcined, the pulverization process is undergone for pulverization to a desired grain size to obtain a second finished material. After the intermediate material being calcined, the pulverization process is undergone for pulverization to a desired grain size to obtain a third finished material. Paint is created, as described later, by adding each of the first finished material, second finished material, and third finished material to a slurry and then, a first sheet body, a second sheet body, and a third sheet body are created, the third sheet body is laminated between the first sheet body and the second sheet body by stacking one sheet body on top of another in the order of the first sheet body, the third sheet body, and the second sheet body to simultaneously calcine each sheet body as a sheet laminated body. The optimum calcining temperature is a temperature preferable for the formation of the intermediate layer and preferably, for example, 850° C. or more and 950° C. or less, more preferably 880° C. or more and 920° C. or less, and most preferably 900° C. or more and 920° C. or less. The calcining time is not specifically limited, but is preferably a half hour or more and two-and-a half hours or less, particularly preferably around two hours.

When the ceramic electronic component 10 is manufactured by including ZnO in both the first dielectric layer 11 and the second dielectric layer 12, ZnO is included in the first base material and the second base material containing Ba, Nd, and Ti as the first additive and the second additive respectively for simultaneous calcination. The first base material contains Ti and the first additive and the second additive contain Zn. With a reaction of Ti and Zn caused by simultaneous calcination of Ti contained in the first base material and Zn contained in the first additive and the second additive, the first dielectric layer 11 and the second dielectric layer 12 are formed, the intermediate layer 13 containing ZnO and $TiO_2$ between the first dielectric layer 11 and the second dielectric layer 12, and ZnO is contained in both the first dielectric layer 11 and the second dielectric layer 12.

Thus, the ceramic electronic component 10 according to the exemplary embodiment has the first dielectric layer 11 and the second dielectric layer 12 as layers composed of different materials and the first dielectric layer 11 and the second dielectric layer 12 can be laminated with stability while possessing strong adhesive strength via the intermediate layer 13 by providing the intermediate layer 13 between the first dielectric layer 11 and the second dielectric layer 12 even if the first dielectric layer 11 and the second dielectric layer 12 are formed by lamination. Therefore, with the formation of the intermediate layer 13 between the first dielectric layer 11 and the second dielectric layer 12, peeling of the laminated first dielectric layer 11 and second dielectric layer 12 can be suppressed.

Method of Manufacturing Ceramic Electronic Components

Next, a suitable method of manufacturing ceramic electronic components having the above-described configuration will be described using drawings. FIG. 2 is a flow chart showing a method of manufacturing ceramic electronic components according to the exemplary embodiment of the present invention. As shown in FIG. 2, the method of manufacturing ceramic electronic components according to the present embodiment includes processes (a) to (c) shown below:

(a) A Finished Material Production Process (Step S11):

Mix a first base material containing Ba, Nd, and Ti and a first additive containing at least ZnO;

Calcine the mixture in an oxygen atmosphere at temperature of 800° C. or more and 950° C. or less to produce a first finished material;

Mix a second base material containing a different material from that of the first base material and a second additive containing at least ZnO;

Calcine the mixture in an oxygen atmosphere at temperature of 800° C. or more and 950° C. or less to produce a second finished material; and Calcine an intermediate material containing a different material from those of the first base material and the second base material in an oxygen atmosphere at temperature of 800° C. or more and 950° C. or less to produce a third finished material (b) A sheet Laminated Body Formation Process (Step S12):

Laminate a third sheet body (third green sheet) obtained by forming a third slurry containing the intermediate material in a sheet shape between a first sheet body (first green sheet) obtained by forming a first slurry containing the first finished material in a sheet shape and a second sheet body (second green sheet) obtained by forming a second slurry containing the second finished material in a sheet shape to form a sheet laminated body by stacking one sheet body on top of another in the order of the first sheet body, the third sheet body, and the second sheet body (c) A Laminated Sintered Body Production Process (Step S13):

Calcine the sheet laminated body to produce a laminated sintered body

Finished Material Production Process: Step S11

The finished material production process (step S11) is a process in which a first base material and a first additive are mixed and calcined to produce a first finished material and a second base material and a second additive are mixed and calcined to produce a second finished material and also an intermediate material containing a different material from those of the first base material and the second base material is calcined to produce a third finished material.

The first base material contains Ba, Nd, and Ti. The first additive contains at least one of ZnO, $B_2$, $O_3$, and CuO. In view of improving adhesive strength between the first dielectric layer 11 and the intermediate layer 13, the first additive preferably contains at least ZnO.

In the finished material production process (step S11), the first base material and the first additive are mixed to produce a first mixture. The first mixture is calcined in an oxygen atmosphere to obtain a first finished material. The calcining temperature for calcination is preferably 800° C. or more and 950° C. or less, more preferably 800° C. or more and 900° C. or less, and most preferably 830° C. or more and 870° C. or less. The calcining time is not specifically limited, but is preferably two hours or more and five hours or less. The first finished material is in a powder form and is pulverized by a wet ball mill or the like. Before the first base material being mixed with the first additive, the first base material may be pulverized into powder and calcined in order to efficiently mix with the first additive. In this case, the calcining temperature for calcination is preferably 1200° C. or more and 1300° C. or less, more preferably 1250° C. or more and 1270° C. or less, and most preferably around 1270° C. The calcining time is not specifically limited, but is preferably two hours or more and five hours or less.

The second base material contains, as described above, a different material from that of the first base material. Like the first additive, the second additive contains at least one of ZnO, $B_2O_3$, $Bi_2O_3$, CoO, MnO, CuO, alkali-earth metal oxide, and glass. In view of improving adhesive strength between the second dielectric layer 12 and the intermediate layer 13, like the first additive, the second additive preferably contains at least ZnO.

In the finished material production process (step S11), the second base material and the second additive are mixed to produce a second mixture. Like when the first mixture is produced, the second mixture is calcined in an oxygen atmosphere to obtain a second finished material. The calcining temperature for calcination is preferably 800° C. or more and 950° C. or less, more preferably 800° C. or more and 900° C. or less, and most preferably 830° C. or more and 870° C. or less. The calcining time is not specifically limited, but is preferably two hours or more and five hours or less. Like the first finished material, the second finished material is also in a powder form and is pulverized by a wet ball mill or the like. Like the first base material, before the second base material being mixed with the second additive, the second base material may be pulverized into powder and calcined in order to efficiently mix with the second additive.

The intermediate material contains, as described above, materials that are not contained in the first base material and the second base material in common. Like when the first mixture and the second mixture are produced, the intermediate material is calcined in an oxygen atmosphere to obtain a third finished material. The calcining temperature for calcination is preferably 800° C. or more and 950° C. or, less, more preferably 800° C. or more and 900° C. or less, and most preferably 830° C. or more and 870° C. or less. The calcining time is not specifically limited, but is preferably two hours or more and five hours or less. Like the first finished material and the second finished material, the third finished material is also in a powder form and is pulverized by a wet ball mill or the like.

After the first finished material, the second finished material, and the third finished material being produced, the manufacturing method proceeds to the sheet laminated body formation process (step S12).

Sheet Laminated Body Formation Process: Step S12

The sheet laminated body formation process (step S12) is a process in which the third sheet body (third green sheet) obtained by forming the third slurry containing the intermediate material in a sheet shape is laminated between the first sheet body (first green sheet) obtained by forming the first slurry containing the first finished material in a sheet shape and the second sheet body (second green sheet) obtained by forming the second slurry containing the second finished material in a sheet shape to form the sheet laminated body by stacking one sheet body on top of another in the order of the first sheet body, the third sheet body, and the second sheet body.

In the sheet laminated body formation process (step S12), a predetermined amount of polyvinyl alcohol, acryl, or ethylcellulose based organic binder is compounded into the first finished material and mixed to produce the first slurry containing the first finished material. The first slurry is used for sheet formation and applied onto a substrate at a plurality of locations in a sheet shape by the doctor blade method or the like. The first slurry applied to the substrate is dried to obtain a plurality of first green sheets. The formation method of first green sheet is not specifically limited as long as the first slurry can be applied in a sheet shape and may be a wet formation method such as a sheet method or a printing method or a dry formation method such as press molding.

Like the first finished material, the second slurry containing the second finished material and the third slurry containing the third finished material are produced for the second finished material and the third finished material respectively. Like the first slurry, the second slurry and the third slurry are also used for sheet formation. The third slurry is applied onto first sheet bodies formed on the substrate in a sheet shape. The third slurry applied to the first green sheets is dried to form a plurality of third green sheets. Then, the second slurry is applied onto third sheet bodies formed in a sheet shape. The second slurry applied to the third green sheets is dried to form a plurality of second green sheets. Like the first slurry, the second slurry and the third slurry are applied by the doctor blade method or the like.

The third green sheet obtained by forming the third slurry in a sheet shape is laminated between the first green sheet and the second green sheet to form a sheet laminated body on the substrate by stacking one sheet body on top of another in the order of the first sheet body, the third sheet body, and the second sheet body. After the sheet laminated body being produced, the sheet laminated body is removed from the substrate to proceed to the laminated sintered body production process (step S13).

Laminated Sintered Body Production Process: Step S13

The laminated sintered body production process (step S13) is a process in which the sheet laminated body is calcined and cured to produce a laminated sintered body. In the laminated sintered body production process (step S13), the obtained sheet laminated body is cut into predetermined forms to form chip-type sheet laminated bodies and after the binder contained in the first green sheet, second green sheet, and third green sheet is removed, the sheet laminated bodies are calcined to produce laminated sintered bodies. It is preferable to carry out calcination in an oxygen atmosphere like the air. The optimum calcining temperature is a temperature preferable for the formation of the intermediate layer and preferably, for example, 850° C. or more and 950° C. or less, more preferably 880° C. or more and 920° C. or less, and most preferably 900° C. or more and 920° C. or less.

The first green sheet becomes the first dielectric layer 11 through calcination, the second green sheet becomes the second dielectric layer 12 through calcination, and the third green sheet becomes the intermediate layer 13 through calcination. The first green sheet is a sheet formed into a sheet shape by using the first base material and thus, Ba, Nd, and Ti contained in the first base material are also contained in the first green sheet. By calcining the sheet laminated body, Ba, Nd, and Ti contained in the first green sheet become BaO, $Nd_2O_3$, and $TiO_2$ respectively and the first dielectric layer 11 contains BaO, $Nd_2O_3$, and $TiO_2$ as main components. Thus, Ba, Nd, and Ti contained in the first base material are contained in the first dielectric layer 11 as main components thereof. The second green sheet is a sheet formed into a sheet shape by using the second base material and thus, the material contained in the second base material is also contained in the second green sheet. Thus, the material contained in the second base material is contained in the second dielectric layer 12 as a main component. The third green sheet is a sheet formed into a sheet shape by using the intermediate material and thus, the material contained in the intermediate material is also contained in the third green sheet. The intermediate material contains, as described above, materials that are not contained in the first base material and the second base material in common and thus, an intermediate material obtained by calcining a sheet laminated body becomes a layer containing main components that are not contained in the first dielectric layer 11 and the second dielectric layer 12 in common. With the presence of the intermediate layer 13 between the first dielectric layer 11 and the second dielectric layer 12, the first dielectric layer 11 and the second dielectric layer 12 can be laminated while possessing strong adhesive strength via the intermediate layer 13.

After an external electrode and an internal electrode being formed in the obtained laminated sintered body, a ceramic electronic component can be obtained by plating the laminated sintered body to a predetermined film thickness. Thus, the ceramic electronic component obtained by the method of manufacturing ceramic electronic components according to the present embodiment suppresses generation of pores in the boundary between the first dielectric layer 11 or the second dielectric layer 12 and the intermediate layer 13 and an occurrence of shift between the first dielectric layer 11 or the second dielectric layer 12 and the intermediate layer 13 and the first dielectric layer 11 and the second dielectric layer 12 can be laminated with stability while possessing strong adhesive strength via the intermediate layer 13 and therefore, laminated dielectric layers can be prevented from peeling so that highly reliable ceramic electronic components can be manufactured.

Glass powder may be mixed with one of or both of the first green sheet and the second green sheet. Glass powder whose glass softening point is 450° C. or more and 650° C. or less is preferably used. Components contained in a material used to form an intermediate layer promotes liquid phase sintering and sintering of the intermediate layer through glass whose softening point is low and thus, the intermediate layer is formed with a certain thickness. Also, the first dielectric layer and the second dielectric layer can be laminated while possessing strong adhesive strength via the intermediate layer. If the first dielectric layer and the second dielectric layer are simultaneously sintered, the Q factor of the ceramic electronic component can be improved by glass contained in one of or both of the first dielectric layer and the second dielectric layer.

For printing of an internal electrode, the first green sheet and the second green sheet are alternately stacked a plurality of times while an Ag based metal of a conductive material to be an internal electrode is arranged therebetween and the layered product is cut into predetermined dimensions to form chip-type sheet laminated bodies. In this case, the optimum calcining temperature is a temperature preferable for the formation of the intermediate layer and preferably, for example, 850° C. or more and 950° C. or less, more preferably 880° C. or more and 920° C. or less, and most preferably 900° C. or more and 920° C. or less. By forming an external electrode in the obtained laminated sintered body, a ceramic electronic component including an internal electrode composed of Ag based metal can be produced. For the external electrode, an aid material such as a glass frit or an oxide is frequently contained in the electrode. Thus, the printing temperature that is lower than the temperature at which a chip is calcined is used for printing/calcinations. For example, the temperature of 650° C. or more and 700° C. or less is used for printing.

Ceramic Electronic Component

A ceramic electronic component in the present embodiment can suitably be used, for example, as a ceramic electronic component of a multilayer device, which is a kind of high-frequency device. The multilayer device has a dielectric device such as a capacitor and an inductor integrally produced therein or manufactured by using a multilayer ceramic substrate composed of a plurality of ceramic layers integrally embedded therein. Such multilayer ceramic substrates are manufactured by using the method of manufacturing ceramic electronic components according to the present embodiment described above. The ceramic electronic component according to the present embodiment can also be suitably used, in addition to the multilayer device, for an LC filter. FIG. 3 is a conceptual diagram schematically showing an embodiment when a ceramic electronic component in the present embodiment is used as an LC filter. As shown in FIG. 3, an LC filter 20 includes capacitors 21-1 to 21-3 and a coil 22. The capacitors 21-1 to 21-3 are connected to the coil 22 by a via (via conductor) 23. The capacitor portion of the LC filter 20 has a three-layer structure, but a ceramic electronic component in the present embodiment is not limited to the three-layer structure and any multi-layer structure may be adopted. Thus, a ceramic electronic component in the present embodiment can suitably be used as a multilayer SMD for an LC filter.

A ceramic electronic component in the present embodiment can also be suitably used as a ceramic electronic component for a capacitor, a low-pass filter (LPF), a band-pass filter (BPF), a diplexer (DPX), a coupler (directional coupler), and a balun (balance-unbalance impedance converter).

The present invention will be described more specifically below using examples and comparative examples, but the present invention is not limited to the following examples.

Example 1

Evaluation of Diffusion of Components Contained in the Intermediate Layer

A ceramic electronic component constituted of one layer of the first dielectric layer 11, the second dielectric layer 12, and the intermediate layer 13 is produced. Table 1 shows each component contained in each layer of the first dielectric layer 11, the second dielectric layer 12, and the intermediate layer 13 and the amount of addition thereof (mass field) when a ceramic electronic component is produced. The ceramic electronic component containing the first dielectric layer 11, the second dielectric layer 12, and the intermediate layer 13 containing components shown in Table 1 and prepared by amounts shown in Table 1 is produced.

Components contained in both the first dielectric layer 11 and the second dielectric layer 12 are BaO, ZnO, and CuO. Components contained only in the first dielectric layer 11 are $Nd_2O_3$ and $TiO_2$. Components contained only in the second dielectric layer 12 are MgO, $SiO_2$, SrO, CaO, and $Ag_2O$. The diffusion ratio in the intermediate layer 13 of components contained in both the first dielectric layer 11 and the second dielectric layer 12, components contained only in the first dielectric layer 11, and components contained only in the second dielectric layer 12 is verified. Also, the diffusion ratio of each component shown in Table 1 and contained in the intermediate layer 13 is calculated according to the following expression (6).

((Value in a region on the side of the dielectric layer on which the component is contained more in the intermediate layer)−value in a region on the side of the dielectric layer on which the component is contained less in the intermediate layer))/(Value in a region on the side of the dielectric layer of the first dielectric layer 11 or the second dielectric layer 12 on which the component is contained more in the intermediate layer) (6)

Table 1 shows results of the diffusion ratio.

TABLE 1

|  | BaO | $Nd_2O_3$ | $TiO_2$ | MgO | $SiO_2$ | SrO | ZnO | $Bi_2O_3$ | CoO | $MnO_2$ | CaO | $Ag_2O$ | CuO | Total |
|---|---|---|---|---|---|---|---|---|---|---|---|---|---|---|
| 1st dielectric layer (mass %) | 20.87 | 37.80 | 37.98 | 0.00 | 0.00 | 0.00 | 1.96 | 0.00 | 0.00 | 0.00 | 0.00 | 0.49 | 0.99 | 100.08 |
| 1st dielectric layer side | 19.18 | 22.40 | 26.37 | 11.38 | 10.50 | 0.48 | 5.03 | 1.30 | 0.00 | 0.27 | 0.75 | 0.80 | 1.54 | 100.00 |
| Intermediate layer (mass %) | 14.08 | 23.46 | 24.04 | 16.06 | 14.22 | 0.29 | 3.97 | 1.44 | 1.00 | 0.60 | 0.48 | 0.36 | 0.00 | 100.01 |
| 2nd dielectric layer side | 14.31 | 19.62 | 25.34 | 16.57 | 11.52 | 0.51 | 6.83 | 0.91 | 0.00 | 0.34 | 0.70 | 0.88 | 2.48 | 100.01 |
| 2nd dielectric layer (mass %) | 0.12 | 0.00 | 0.00 | 48.76 | 35.11 | 0.87 | 10.17 | 0.00 | 0.00 | 0.00 | 1.69 | 0.00 | 3.39 | 100.11 |
| Diffusion ratio (%) | 25.39 | 12.41 | 3.91 | 31.32 | 8.85 | 5.88 | 26.35 | 30.00 | — | 20.59 | 6.67 | 9.09 | 37.90 |  |

Figure 4:
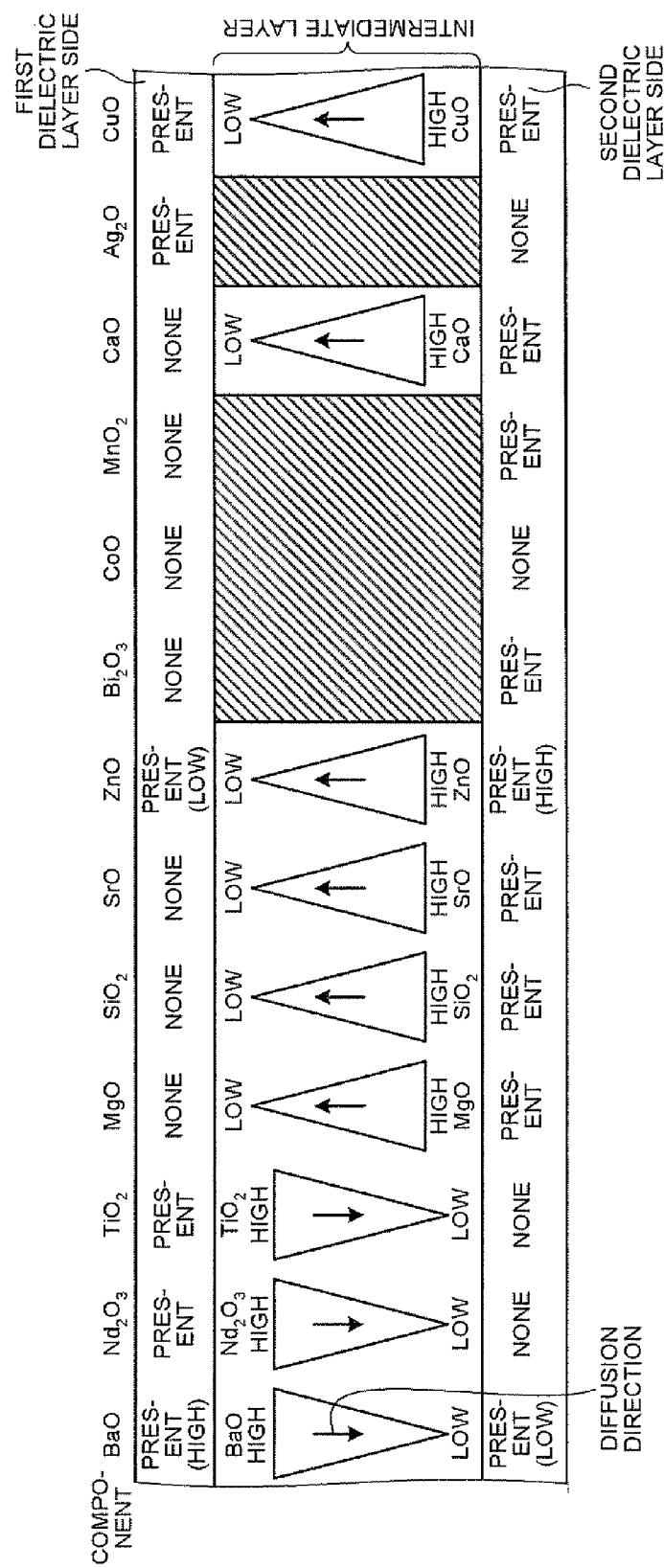
FIG. 4 is an explanatory view schematically showing a diffusion state of components contained in an intermediate layer.

FIG. 4 is an explanatory view schematically showing a diffusion state of components contained in the intermediate layer. In FIG. 4, the arrow shows the diffusion direction of each component.

Figure 5:
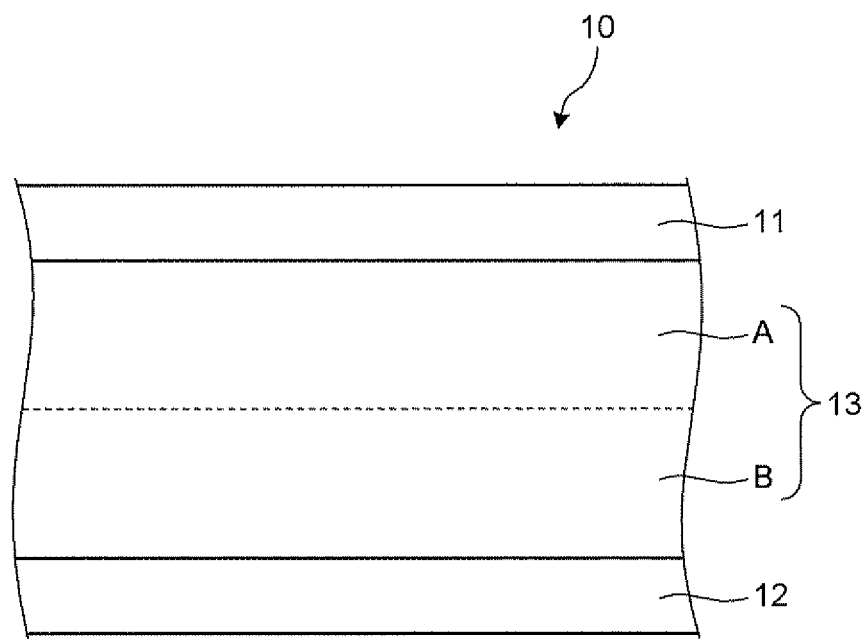
FIG. 5 is a simplified diagram showing a region of the intermediate layer on a side of a first dielectric layer and a region on the side of a second dielectric layer.

When analyzing components contained in the intermediate layer 13, components contained in a region of the intermediate layer 13 on the side of the first dielectric layer 11 and components contained in a region of the intermediate layer 13 on the side of the second dielectric layer 12 are measured. FIG. 5 is a diagram showing a region of the intermediate layer on a side of the first dielectric layer and a region on the side of the second dielectric layer in a simplified form. As shown in FIG. 5, the region of the intermediate layer 13 on the side of the first dielectric layer 11 is a region A of the intermediate layer 13 on the side of the first dielectric layer 11 when the intermediate layer 13 is divided into the side of first dielectric layer 11 and the side of the second dielectric layer 12. The region of the intermediate layer 13 on the side of the second dielectric layer 12 is a region B on the side of the second dielectric layer 12 of the intermediate layer 13 divided into two regions. Components contained in both the first dielectric layer 11 and the second dielectric layer 12

As shown in Table 1, components contained in both the first dielectric layer 11 and the second dielectric layer 12 are BaO, ZnO, and CuO. BaO contained inside the intermediate layer 13 is more distributed on the side of the first dielectric layer 11 of the intermediate layer 13 than on the side of the second dielectric layer 12 thereof. Thus, it is revealed that BaO contained more on the side of the first dielectric layer 11 than on the side of the second dielectric layer 12 diffuses from the side of the first dielectric layer 11 and inside the intermediate layer 13, from the side of the first dielectric layer 11 toward the side of the second dielectric layer 12. ZnO and CuO contained inside the intermediate layer 13 are more distributed on the side of the second dielectric layer 12 of the intermediate layer 13 than on the side of the first dielectric layer 11 thereof. Thus, it is revealed that ZnO and CuO contained more on the side of the second dielectric layer 12 than on the side of the first dielectric layer 11 diffuses from the side of the second dielectric layer 12 and inside the intermediate layer 13, from the side of the second dielectric layer 12 toward the side of the first dielectric layer 11.

Components Contained Only in the First Dielectric Layer 11

As shown in Table 1, components contained only in the first dielectric layer 11 are $Nd_2O_3$, $TiO_2$, and $Ag_2O$, $Nd_2O_3$ and $TiO_2$ are more distributed on the side of the first dielectric layer 11 of the intermediate layer 13 than on the side of the second dielectric layer 12 thereof. Thus, it is verified that $Nd_2O_3$ and $TiO_2$ inside the intermediate layer 13 diffuse from the side of the first dielectric layer 11 toward the side of the second dielectric layer 12. On the other hand, $Ag_2O$ diffuses more from the side of the first dielectric layer 11 inside the intermediate layer 13 toward the side of the second dielectric layer 12 thereof. This can be considered to be caused by diffusion of $Ag_2O$ contained as a component constituting the intermediate layer 13 toward the side of the second dielectric layer 12. Thus, it is verified that $Nd_2O_3$ and $TiO_2$ contained only in the first dielectric layer 11 are more distributed in a boundary between the intermediate layer 13 and the first dielectric layer 11 and diffuse from the side of the first dielectric layer 11 toward the side of the second dielectric layer 12.

Components Contained Only in the Second Dielectric Layer 12

As shown in Table 1, components contained only in the second dielectric layer 12 are MgO, $SiO_2$, SrO, and CaO. MgO, $SiO_2$, and SrO are more distributed on the side of the second dielectric layer 12 of the intermediate layer 13 than on the side of the first dielectric layer 11 thereof. On the other hand, Cao is distributed almost equally on the side of the first dielectric layer 11 and on the side of the second dielectric layer 12 of the intermediate layer 13. Thus, it is verified that MgO, $SiO_2$, and SrO contained only in the second dielectric layer 12 are more distributed on the side of the second dielectric layer 12 of the intermediate layer 13 and diffuse from the side of the second dielectric layer 12 toward the side of the first dielectric layer 11.

Thus, components contained in only the first dielectric layer 11 or the second dielectric layer 12 are more distributed on the side of the dielectric layer of components contained only in one dielectric layer inside the intermediate layer 13, diffused in the intermediate layer, distributed less toward the side of another dielectric layer. Thus, components contained in only one dielectric layer are more distributed in a boundary with the side of the one dielectric layer inside the intermediate layer 13 and thus, adhesive strength to the dielectric layer can be improved.

Example 2

Production of Base Materials and Sheet Bodies

Base materials containing components constituting each of the first dielectric layer, the second dielectric layer, and the intermediate layer and a method of producing sheet bodies used to form the first dielectric layer and the second dielectric layer will be described. Base materials to be used include BaNdTiO based oxide, $2MgO.SiO_2$, a mixture of BaNdTiO based oxide and $2MgO.SiO_2$, and $SiO_2$—$Al_2O_3$—$B_2O_3$—SrO based glass. Sheet bodies include a sheet body of BaNdTiO based oxide, a sheet body of $2MgO.SiO_2$, a sheet body of a mixture of BaNdTiO based oxide and $2MgO.SiO_2$, and a sheet body of $SiO_2$—$Al_2O_3$—$B_2O_3$—SrO based glass.

1-1. Production of BaNdTiO Based Oxide (BaO—$Nd_2O_3$—$TiO_2$)

Barium carbonate ($BaCO_3$) of 24.36% by mass, neodymium hydroxide ($Nd(OH)_3$) of 40.29% by mass, and titanium oxide ($TiO_2$) of 35.35% by mass are weighed. The sum of $BaCO_3$, $Nd(OH)_3$, and $TiO_2$ is adjusted to 100% by mass, the weighed powder is put into a nylon ball mill, and ion exchanged water and a commercial dispersing agent are added to produce a slurry in which the slurry concentration is 25% and the slurry is mixed for 16 hours.

The mixed slurry is recovered and dried at 120° C. for 24 hours and then, a dried mass is ground by a Wiley mill (trade name: WT-50, manufactured by Miki Seisakusho) to allow powder to pass by sieving with shaking using a #30 mesh. The recovered powder is packed into a small box case made of magnesia and calcined in an electric furnace in an atmosphere of the air at 1270° C. for two hours to obtain calcined powder (called "primary calcined powder") of base materials.

Boron oxide ($B_2O_3$) of 1.5% by mass, zinc oxide (ZnO) of 2.0% by mass, and copper oxide (CuO) of 1.0% by mass are weighed against the primary calcined powder of 100% by mass. The weighed powder is put into the nylon ball mill and ion exchanged water is added to produce a slurry in which the slurry concentration is 33% and the slurry is mixed for 16 hours.

The mixed slurry is recovered and dried at 120° C. for 24 hours and then, a dried mass is ground by the Wiley mill to allow powder to pass by sieving with shaking using a #300 mesh. The recovered powder is packed into the small box case made of magnesia and calcined in the electric furnace in an atmosphere of the air at 850° C. for two hours to obtain calcined powder (called "secondary calcined powder") of a mixture of base materials and additives.

The obtained secondary calcined powder is weighed at 99% by mass and Ag powder at 1% by mass, the powder thereof is put into the nylon ball mill and alcohol is added to produce a slurry in which the slurry concentration is 33% and the slurry is mixed for 16 hours to obtain a pulverized finished material.

The mixed alcohol slurry is recovered and dried at 80° C. to 120° C. for 24 hours and then, a dried mass is ground by the Wiley mill to allow powder to pass by sieving with shaking using the #300 mesh to obtain the finished material.

1-2. Production of Sheet Bodies of BaNdTiO Based Oxide (BaO—$Nd_2O_3$—$TiO_2$)

Predetermined amounts of commercial toluene (primary), alcohol (superfine), a dispersing agent, an acrylic resin lacquer, and commercial n-butyl-phthalyl n-butyl-glycolate as a plasticizer are added to the finished material obtained according to the above method, the finished material and additives are put into a polyethylene ball mill and mixed for 16 hours to obtain a slurry for sheet body formation. The slurry is applied onto a substrate by the doctor blade method to produce a plurality of sheet bodies.

2-1. Production of $2MgO.SiO_2$

Boron oxide ($B_2O_3$) of 8.0% by mass, zinc oxide (ZnO) of 12.0% by mass, copper oxide (CuO) of 4.0% by mass, and calcium carbonate ($CaCO_3$) of 1.0% by mass are weighed against forsterite ($2MgO.SiO_2$) of 100% by mass. The weighed powder is put into the nylon ball mill and ion exchanged water is added to produce a slurry in which the slurry concentration is 33% and the slurry is mixed for 16 hours.

The mixed slurry is recovered and dried at 120° C. for 24 hours and then, a dried mass is ground by the Wiley mill to allow powder to pass by sieving with shaking using the #300 mesh. The recovered powder is packed into the small box case made of magnesia and calcined in the electric furnace in an atmosphere of the air at 850° C. for two hours to obtain calcined powder of a mixture of base materials and additives.

The obtained calcined powder is weighed at 100% by mass and lithium based glass (LS-5 manufactured by Asahi Glass) at 3% by mass, the calcined powder is put into the nylon ball mill and alcohol is added to produce a slurry in which the slurry concentration is 33% and the slurry is mixed for 16 hours to obtain a pulverized finished material.

The slurry containing the finished material is recovered and dried at 80° C. to 120° C. for 24 hours and then, a dried mass is ground by the Wiley mill to allow powder to pass by sieving with shaking using the #300 mesh to obtain the finished material.

2-2. Production of Sheet Bodies of $2MgO.SiO_2$

Predetermined amounts of commercial toluene (primary), alcohol (superfine), a dispersing agent, an acrylic resin lacquer, and commercial n-butyl-phthalyl n-butyl-glycolate as a plasticizer are added to the finished material obtained according to the above method, the finished material and additives are put into the polyethylene ball mill and mixed for 16 hours to obtain a slurry for sheet body formation. The slurry is applied onto a substrate by the doctor blade method to produce a plurality of sheet bodies.

3-1. Production of Composite Material of BaNdTiO Based Oxide and $2MgO.SiO_2$

Barium carbonate ($BaCO_3$) of 24.36% by mass, neodymium hydroxide ($Nd(OH)_3$) of 40.29% by mass, and titanium oxide ($TiO_2$) of 35.35% by mass are weighed and the sum of $BaCO_3$, $Nd(OH)_3$, and $TiO_2$ is adjusted to 100% by mass. The weighed powder is put into the nylon ball mill and ion exchanged water and a commercial dispersing agent are added to produce a slurry in which the slurry concentration is 25% and the slurry is mixed for 16 hours.

The mixed slurry is recovered and dried at 120° C. for 24 hours and then, a dried mass is ground by the Wiley mill to allow powder to pass by sieving with shaking using the #30 mesh. The recovered powder is packed into the small box case made of magnesia and calcined in the electric furnace in an atmosphere of the air at 1270° C. for two hours to obtain calcined powder (called "primary calcined powder") of base materials.

Forsterite ($2MgO.SiO_2$) of 31.5% by mass is weighed against the primary calcined powder of 68.5% by mass to adjust the sum of the primary calcined powder and forsterite to 100% by mass. $B_2O_3$ of 2.48% by mass, ZnO of 6.67% by mass, $Bi_2O_3$ of 3.14% by mass, CoO of 1.12% by mass, $MnCO_3$ of 0.66% by mass, and $CaCO_3$ of 1.07% by mass are weighed, the weighed powder is put into the nylon ball mill and ion exchanged water is added to produce a slurry in which the slurry concentration is 33% and the slurry is mixed for 16 hours.

The mixed slurry is recovered and dried at 120° C. for 24 hours and then, a dried mass is ground by the Wiley mill to allow powder to pass through a sieve of the #300 mesh. The recovered powder is packed into the small box case made of magnesia and calcined in the electric furnace in an atmosphere of the air at 850° C. for two hours to obtain calcined powder (called "secondary calcined powder") of a mixture of base materials and additives.

The obtained secondary calcined powder is weighed at 100% by mass and Ag powder at 0.75% by mass, the powder thereof is put into the nylon ball mill and alcohol is added to produce a slurry in which the slurry concentration is 33% and the slurry is mixed for 16 hours to obtain a pulverized finished material.

The mixed alcohol slurry is recovered and dried at 80° C. to 120° C. for 24 hours and then, a dried mass is ground by the Wiley mill to allow powder to pass by sieving with shaking using the #300 mesh to obtain the finished material.

3-2. Production of Sheet Bodies of composite Material of BaNdTiO Based Oxide and $2MgO.SiO_2$ Predetermined amounts of commercial toluene (primary), alcohol (superfine), a dispersing agent, an acrylic resin lacquer, and commercial n-butyl-phthalyl n-butyl-glycolate as a plasticizer are added to the finished material obtained according to the above method, the finished material and additives are put into the polyethylene ball mill and mixed for 16 hours to obtain a slurry for sheet body formation. The slurry is applied onto a substrate by the doctor blade method to produce a plurality of sheet bodies.

4-1. Production of $SiO_2$—$Al_2O_3$—$B_2O_3$—SrO Based Glass $SiO_2$ of 55% by mass, $Al_2O_3$ of 10% by mass, $B_2O_3$ of 5% by mass, and SrO of 30% by mass are weighed to adjust the sum of the four oxides to 100% by mass. The weighed powder is put into a shaker mixer for dry blending.

The dry-blended powder is put into a quartz crucible and held at 1400° C. for one hour by the electric furnace to melt the powder. The melt is cast into water to obtain granulated glass, which is dried at 120° C. for two hours or more by a drier to eliminate moisture.

The dried granulated glass is ground by the Wiley mill to allow powder to pass by sieving with shaking using the #300 mesh, thereby obtaining $SiO_2$—$Al_2O_3$—$B_2O_3$—SrO based glass powder.

The glass powder passed through the #300 mesh is weighed at 100% by mass, the powder thereof is put into the nylon ball mill and alcohol is added to produce a slurry in which the slurry concentration is 33% and the slurry is mixed for 16 hours and pulverized for preliminary grinding.

$Al_2O_3$ of 55% by mass (here described against the glass powder of 100% by mass) is weighed into the preliminarily ground slurry and alcohol is added to produce a slurry in which the slurry concentration is 33% and the slurry is mixed for 16 hours and pulverized.

The mixed alcohol slurry is recovered and dried at 80° C. to 120° C. for 24 hours and then, a dried mass is ground by the Wiley mill to allow powder to pass by sieving with shaking using the #300 mesh to obtain the finished material.

4-2. Production of Sheet Bodies of $SiO_2$—$Al_2O_3$—$B_2O_3$—SrO based glass

Predetermined amounts of commercial toluene (primary), alcohol (superfine), a dispersing agent, an acrylic resin lacquer, and commercial n-butyl-phthalyl n-butyl-glycolate as a plasticizer are added to the finished material obtained according to the above method, the finished material and additives are put into the polyethylene ball mill and mixed for 16 hours to obtain a slurry for sheet body formation. The slurry is applied onto a substrate by the doctor blade method to produce a plurality of sheet bodies.

Examples 2-1 to 2-4 and Comparative Examples 2-1 to 2-4

The BaNdTiO based oxide, $2MgO.SiO_2$, composite material of BaNdTiO based oxide and $2MgO.SiO_2$, and $SiO_2$—$Al_2O_3$—$B_2O_3$—SrO based glass obtained as described above are used as base materials to form a first dielectric layer and a second dielectric layer. One or more of ZnO, $B_2O_3$, CoO, MnO, $Bi_2O_3$, $CaCO_3$, Ag, CuO, $\alpha$-$SiO_2$, and $Al_2O_3$ are used as additives. These are used as base materials or additives to produce laminated sintered bodies (chips) formed in a chip shape under conditions shown in Table 1.

Chip Manufacture Using Sheet Bodies

Example 2-1

Before Calcination

Ag paste (manufactured by TDK) is printed on a BaO—NdO$_3$—TiO$_2$ ceramic sheet in a predetermined capacitor pattern shape (pattern in which the shape of chip after calcination is 4.5 mm in the longitudinal direction and 3.2 mm in the width direction) and the ceramic sheet is dried at 120° C. for 15 min.

Next, a 2MgO.SiO$_2$ ceramic sheet as an external layer, the printed BaO—NdO$_3$—TiO$_2$ ceramic sheet as an internal sheet, and a ceramic sheet obtained by mixing 2MgO.SiO$_2$ and BaO—NdO$_3$—TiO$_2$ as an intermediate layer are stacked (the internal layer has a four-layer structure) and pressed under conditions of 70° C., 700 kg/cm$^2$, and 7 min. Then, the laminated structure is cut into predetermined capacitor forms by a wet cutting process, unbound at 350° C. for 1 hour using a batch furnace and then, calcined in an oxygen atmosphere at 950° C. for 2.5 hours to obtain chips.

After Calcination

To form an external terminal at an edge of the calcined chip, commercial external terminal paste of Ag is manually applied to both sides of the terminal and dried at 120° C. for 15 min before being calcined by a continuous kiln (manufactured by LINDBERG) at 670° C. The chip whose edge is calcined is plated with Cu—Ni—Sn using an electroplating system to a predetermined film thickness by each plating.

Examples 2-2 to 2-4 and Comparative Examples 2-1 to 2-4

The formation method of a chip of Examples 2-2 to 2-4 and Comparative Examples 2-1 to 2-4 is the same as that of Example 2-1 except that conditions shown in Tables 2-1 and 2-2 are changed.

Evaluation of Chips

Using obtained chips, components preferentially diffused to a boundary between the first dielectric layer and the intermediate layer (1st diffusion component in Table 2-2), diffusion ratio of preferential diffusion components to the boundary between the first dielectric layer and the intermediate layer (1st diffusion ratio in Table 2-2), continuity of the boundary between the first dielectric layer and the intermediate layer (1st continuity in Table 2-2), preferential diffusion components in the boundary between the second dielectric layer and the intermediate layer (2nd diffusion component in Table 2-2), diffusion ratio of preferential diffusion components to the boundary between the second dielectric layer and the intermediate layer (2nd diffusion ratio in Table 2-2), continuity of the boundary between the second dielectric layer and the intermediate layer (2nd continuity in Table 2-2), whether an etchant has infiltrated into the intermediate layer (Infiltration in Table 2-2), and peeling conditions of the first dielectric layer and the second dielectric layer (Peeling in Table 2-2), are verified. Verification method of evaluation of relations between the dielectric layers and the intermediate layer A chip after being calcined is embedded in a container using commercial epoxy resin and polished by using a polishing agent and after being finished as mirror surface polishing, an SEM-EDS observation of the polished surface is made through a scanning electron microscope (trade name: JSM-6700, manufactured by JEOL), and an EDS image (2000×) of the boundary surface after the calcination is taken to verify the state of diffusion element distribution in the boundary. From the obtained state of diffusion element distribution in the boundary surface, preferential diffusion components in the boundary between the first dielectric layer or the second dielectric layer and the intermediate layer, the gradation rate of preferential diffusion components in the boundary between the first dielectric layer or the second dielectric layer and the intermediate layer, continuity of the boundary between the first dielectric layer or the second dielectric layer and the intermediate layer are evaluated.

Verification Method of Whether an Etchant on the Boundary Surface of Chip has Infiltrated into the Intermediate Layer The plated chip is broken by cutting pliers, a broken boundary surface is observed through a scanning electron microscope (trade name: JSM-300, manufactured by JEOL), and a COMPO image (2000×) of the boundary surface after the calcination is taken to verify whether an etchant has infiltrated into the boundary surface.

Verification Method of Peeling Conditions on the Boundary Surface of Chip

Three surfaces (plane, flank, and end face) of the plated chip are verified through a metallurgical microscope to check ten locations of each sample for any failure such as peeling.

Tables 2-1 and 2-2 show results of the above measurement made by using the obtained chips.

TABLE 2-1

| | 1st dielectric layer | | 2nd dielectric layer | | Intermediate layer | |
|---|---|---|---|---|---|---|
| | 1st main component | 1st sub component | 2nd main component | 2nd sub component | main component | sub component |
| Ex. 2-1 | BaNdTiO base oxide | ZnO, CuO, B$_2$O$_3$, Ag | 2MgO•SiO$_2$ | ZnO, CuO, B$_2$O$_3$, CaCO$_3$, Li base glass | BaNdTiO base oxide + 2MgO•SiO$_2$ | ZnO, B$_2$O$_3$, CoO, MnO, Bi$_2$O$_3$, CaCO$_3$, Ag |
| Ex. 2-2 | BaNdTiO base oxide | ZnO, CuO, B$_2$O$_3$, Ag | 2MgO•SiO$_2$ | ZnO, CuO, B$_2$O$_3$, CaCO$_3$, Na base glass | BaNdTiO base oxide + 2MgO•SiO$_2$ | ZnO, B$_2$O$_3$, CoO, MnO, Bi$_2$O$_3$, CaCO$_3$, Ag |
| Ex. 2-3 | BaNdTiO base oxide | ZnO, CuO, B$_2$O$_3$, Ag | 2MgO•SiO$_2$ | ZnO, CuO, B$_2$O$_3$, CaCO$_3$, Li base glass | BaNdTiO base oxide + 2MgO•SiO$_2$ | ZnO, B$_2$O$_3$, CoO, MnO, CuO, Bi$_2$O$_3$, CaCO$_3$, Ag |
| Ex. 2-4 | BaNdTiO base oxide | ZnO, CuO, B$_2$O$_3$, Ag | 2MgO•SiO$_2$ | ZnO, CuO, B$_2$O$_3$, CaCO$_3$, Na base glass | BaNdTiO base oxide + 2MgO•SiO$_2$ | ZnO, B$_2$O$_3$, CoO, MnO, CuO, Bi$_2$O$_3$, CaCO$_3$, Ag |
| Cmp. 2-1 | BaNdTiO base oxide | ZnO, CuO, B$_2$O$_3$, Ag | 2MgO•SiO$_2$ | ZnO, CuO, B$_2$O$_3$, CaCO$_3$, Li base glass | SiO$_2$—Al$_2$O$_3$—BaO—B$_2$O$_3$ base glass | α-SiO$_2$, Al$_2$O$_3$ |

TABLE 2-1-continued

| | 1st dielectric layer | | 2nd dielectric layer | | Intermediate layer | |
|---|---|---|---|---|---|---|
| | 1st main component | 1st sub component | 2nd main component | 2nd sub component | main component | sub component |
| Cmp. 2-2 | BaNdTiO base oxide | ZnO, CuO, $B_2O_3$, Ag | 2MgO•$SiO_2$ | ZnO, CuO, $B_2O_3$, $CaCO_3$, Na base glass | $SiO_2$—$Al_2O_3$—BaO—$B_2O_3$ base glass | α-$SiO_2$, $Al_2O_3$ |
| Cmp. 2-3 | BaNdTiO base oxide | ZnO, CuO, $B_2O_3$, Ag | 2MgO•$SiO_2$ | ZnO, CuO, $B_2O_3$, $CaCO_3$, Li base glass | $SiO_2$—$Al_2O_3$—$B_2O_3$—SrO base glass | $Al_2O_3$ |
| Cmp. 2-4 | BaNdTiO base oxide | ZnO, CuO, $B_2O_3$, Ag | 2MgO•$SiO_2$ | ZnO, CuO, $B_2O_3$, $CaCO_3$, Na base glass | $SiO_2$—$Al_2O_3$—$B_2O_3$—SrO base glass | $Al_2O_3$ |

TABLE 2-2

| | 1st diffusion component | 1st diffusion ratio | 1st continuity | 2nd diffusion component | 2nd diffusion ratio | 2nd continuity | Infiltration | Peeling |
|---|---|---|---|---|---|---|---|---|
| Ex. 2-1 | $Nd_2O_3$, $TiO_2$ | $Nd_2O_3$: 12.4% $TiO_2$: 3.9% | Good | MgO, $SiO_2$, SrO, CaO | MgO: 31.3% $SiO_2$: 8.9% SrO: 5.9% CaO: 6.7% | Good | None | No |
| Ex. 2-2 | $Nd_2O_3$, $TiO_2$ | $Nd_2O_3$: 10.4% $TiO_2$: 3.9% | Good | MgO, $SiO_2$, SrO, CaO | MgO: 32.3% $SiO_2$: 7.9% SrO: 4.9% $CaO_3$: 7.7% | Good | None | No |
| Ex. 2-3 | $Nd_2O_3$, $TiO_2$ | $Nd_2O_3$: 12.4% $TiO_2$: 3.9% | Good | MgO, $SiO_2$, SrO, CaO | MgO: 31.3% $SiO_2$: 8.9% SrO: 5.9% $CaO_3$: 6.7% | Good | None | No |
| Ex. 2-4 | $Nd_2O_3$, $TiO_2$ | $Nd_2O_3$: 10.4% $TiO_2$: 3.9% | Good | MgO, $SiO_2$, SrO, $CaCO_3$ | MgO: 32.3% $SiO_2$: 7.9% SrO: 4.9% $CaOa_3$: 7.7% | Good | None | No |
| Cmp. 2-1 | *1 | *1 | *1 | *1 | *1 | *1 | Yes | Partial |
| Cmp. 2-2 | *1 | *1 | *1 | *1 | *1 | *1 | Yes | Partial |
| Cmp. 2-3 | *1 | *1 | *1 | *1 | *1 | *1 | Yes | Partial |
| Cmp. 2-4 | *1 | *1 | *1 | *1 | *1 | *1 | Yes | Partial |

*1 Continuity between dielectric layers and intermediate layer is poor and partial peeling is confirmed between dielectric layers and intermediate layer and thus, evaluation is difficult to make Relations Between the First Dielectric Layer and the Intermediate Layer If an intermediate layer having the $SiO_2$—$Al_2O_3$—$B_2O_3$—SrO based glass as main components is used, continuity between the intermediate layer and the first dielectric layer is poor, components diffused to the boundary between the first dielectric layer and the intermediate layer cannot be determined, the diffusion ratio of components diffused to the boundary between the first dielectric layer and the intermediate layer cannot be determined (see Comparative examples 2-1 to 2-4). On the other hand, if a mixture in which BaNdTiO based oxide and 2MgO.$SiO_2$ are mixed is used as an intermediate layer, it is verified that $Nd_2O_3$ and $TiO_2$ are mostly contained in the boundary between the first dielectric layer and the intermediate layer and have diffused from the side of the first dielectric layer in the intermediate layer toward the side of the second dielectric layer thereof, and continuity is verified in the boundary between the first dielectric layer and the intermediate layer (see Examples 2-1 to 2-4). Thus, it is verified that a mixture in which BaNdTiO based oxide and 2MgO.$SiO_2$ are mixed can suitably be used as an intermediate layer to provide continuity with the first dielectric layer.

Relations Between the Second Dielectric Layer and the Intermediate Layer

If an intermediate layer having the $SiO_2$—$Al_2O_3$—$B_2O_3$—SrO based glass as main components is used, also between the second dielectric layer and the intermediate layer, like the relations between the first dielectric layer and the intermediate layer, continuity between the intermediate layer and the second dielectric layer is poor, components diffused to the boundary between the second dielectric layer and the intermediate layer cannot be determined, the diffusion ratio of components diffused to the boundary between the second dielectric layer and the intermediate layer cannot be determined (see Comparative examples 2-1 to 2-4). On the other hand, if a mixture in which BaNdTiO based oxide and 2MgO.$SiO_2$ are mixed is used as an intermediate layer, it is verified that MgO, $SiO_2$, SrO, and CaO are mostly contained in the boundary between the second dielectric layer and the intermediate layer and have diffused from the side of the second dielectric layer in the intermediate layer toward the side of the first dielectric layer thereof, and continuity is verified in the boundary between the second dielectric layer and the intermediate layer (see Examples 2-1 to 2-4). Thus, it is verified that a mixture in which BaNdTiO based oxide and $2MgO.SiO_2$ are mixed can suitably be used as an intermediate layer to provide continuity with the second dielectric layer.

Verification of Whether an Etchant on the boundary surface of Chip has Infiltrated into the Intermediate Layer If an intermediate layer having the $SiO_2$—$Al_2O_3$—$B_2O_3$—SrO based glass as main components is used, infiltration of an etchant to the interface between the intermediate layer and the first dielectric layer or the second dielectric layer after being plated is detected (see Comparative Examples 2-1 to 2-4). On the other hand, if a mixture in which BaNdTiO based oxide and $2MgO.SiO_2$ are mixed is used as an intermediate layer, infiltration of an etchant to the interface between the intermediate layer and the first dielectric layer or the second dielectric layer after being plated is not detected (see Examples 2-1 to 2-4). Thus, it is verified that a mixture in which BaNdTiO based oxide and $2MgO.SiO_2$ are mixed can increase adhesive strength between the first dielectric layer and the second dielectric layer and can suitably be used as an intermediate layer.

Verification of Peeling Conditions on the Boundary Surface of Chip

If an intermediate layer having the $SiO_2$—$Al_2O_3$—$B_2O_3$—SrO based glass as main components is used, peeling when the first dielectric layer and the second dielectric layer are calcined is detected (see Comparative Examples 2-1 to 2-4). On the other hand, if a mixture in which BaNdTiO based oxide and $2MgO.SiO_2$ are mixed is used as an intermediate layer, no peeling when the first dielectric layer and the second dielectric layer are integrated is detected (see Comparative Examples 2-1 to 2-4). Thus, it is verified that a mixture in which BaNdTiO based oxide and $2MgO.SiO_2$ are mixed can increase adhesive strength between the first dielectric layer and the second dielectric layer and can suitably be used as an intermediate layer.

Therefore, it is verified that a ceramic electronic component in the present embodiment has the first dielectric layer and the second dielectric layer laminated via the intermediate layer with stability without the laminated dielectric layers peeling off.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A ceramic electronic component, comprising:
a first dielectric layer containing BaO, $Nd_2O_3$, and $TiO_2$ as main components;
a second dielectric layer containing $Mg_2Sia_4$ as a main component; and
an intermediate layer provided between the first dielectric layer and the second dielectric layer, wherein
the intermediate layer contains:
   a component that is not contained in the second dielectric layer and is contained only in the first dielectric layer in a boundary between the intermediate layer and the first dielectric layer in a higher ratio than in a boundary between the intermediate layer and the second dielectric layer, a ratio of the component that is not contained in the second dielectric layer and is contained only in the first dielectric layer decreasing from a side of the first dielectric layer to a side of the second dielectric layer; and
   a component that is not contained in the first dielectric layer and is contained only in the second dielectric layer in the boundary between the intermediate layer and the second dielectric layer in a higher ratio than in the boundary between the intermediate layer and the first dielectric layer, a ratio of the component that is not contained in the first dielectric layer and is contained only in the second dielectric layer decreasing from the side of the second dielectric layer to the side of the first dielectric layer.

2. The ceramic electronic component according to claim 1, wherein
the first dielectric layer contains BaO, $Nd_2O_3$, and $TiO_2$ as main components and contains oxide as a sub-component, and
the second dielectric layer contains $Mg_2SiO_4$ as the main component and contains oxide and glass as sub-components.

3. The ceramic electronic component according to claim 1, wherein
the component that is not contained in the second dielectric layer and is contained only in the first dielectric layer contains $Nd_2O_3$ and $TiO_2$, and
the component that is not contained in the first dielectric layer and is contained only in the second dielectric layer contains MgO, $SiO_2$, SrO, and CaO.

* * * * *